US006894586B2

(12) United States Patent
Bircumshaw et al.

(10) Patent No.: US 6,894,586 B2
(45) Date of Patent: May 17, 2005

(54) RADIAL BULK ANNULAR RESONATOR USING MEMS TECHNOLOGY

(75) Inventors: Brian L. Bircumshaw, Berkeley, CA (US); Albert P. Pisano, Danville, CA (US); Oliver M. O'Reilly, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 89 days.

(21) Appl. No.: 10/443,610

(22) Filed: May 21, 2003

(65) Prior Publication Data

US 2004/0232501 A1 Nov. 25, 2004

(51) Int. Cl.$^7$ ............................. H03H 9/70; H01S 3/097
(52) U.S. Cl. ..................... 333/133; 239/204; 372/83; 372/61; 356/624
(58) Field of Search ............................. 333/133, 239, 333/204, 202, 116; 372/83, 45, 61; 356/624

(56) References Cited

U.S. PATENT DOCUMENTS

| 4,649,545 A | * | 3/1987 | Lee et al. | .................. 372/61 |
| 5,008,896 A | * | 4/1991 | Martinen et al. | ............. 372/83 |
| 6,438,149 B1 | * | 8/2002 | Tayebati et al. | ............. 372/45 |
| 6,645,784 B2 | * | 11/2003 | Tayebati et al. | ............. 438/46 |

OTHER PUBLICATIONS

Clark et al., "High–Q VHF Micromechanical Contour–Mode Disk Resonators," Technical Digest, IEEE Int. Electron Devices Meeting, San Francisco, CA, Dec. 11–13, 2000, pp. 399–402.

Ki Bang Lee, Steve Ryder, and Liwei Lin, "Design and Fabrication of an Annular High Frequency Resonator," Proceedings of IMECE'02, 2002 ASME, International Mechanical Engineering Congress & Exposition, IMECE2002–33387, New Orleans, Louisiana, Nov. 17–22, 2002.

Steve Ryder, Ki Bang Lee, Xiaofan Meng, and Liwei Lin, "Characterization of Out-of-Plane High Frequency Microresonators by AFM", Technical Digest of the 12th Int'l Conference on Solid State Sensors, Actuators and Microsystems, Boston, Jun. 8–12, 2003.

* cited by examiner

Primary Examiner—Michael Tokar
Assistant Examiner—Lam T. Mai
(74) Attorney, Agent, or Firm—Beyer Weaver & Thomas LLP

(57) ABSTRACT

A MEMS resonator includes an annular resonator body defined by an inner radius and an outer radius, a first electrode positioned within the inner radius and spaced from the resonator body, and a second electrode positioned around the annular resonator body and spaced from the outer radius. The first electrode and the second electrode provide for capacitive drive of the resonator body and capacitive sense of the resonator body. Piezo-resistive sense and piezoelectric drive/sense techniques can also be utilized. The overall extent can be smaller than 1 cm$^2$ in area and positioned on a supporting substrate by a plurality of anchors. The substrate can comprise an RF transceiver integrated circuit with the anchors connecting the drive electrode and sense electrode to the integrated circuit. The resonator is readily fabricated using conventional semiconductor integrated circuit fabrication techniques.

28 Claims, 7 Drawing Sheets

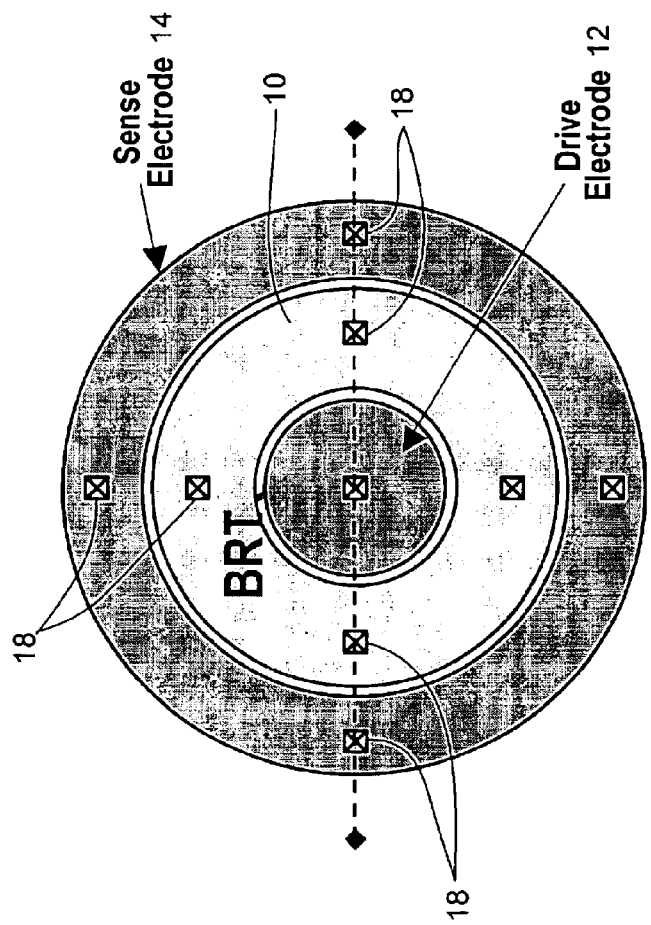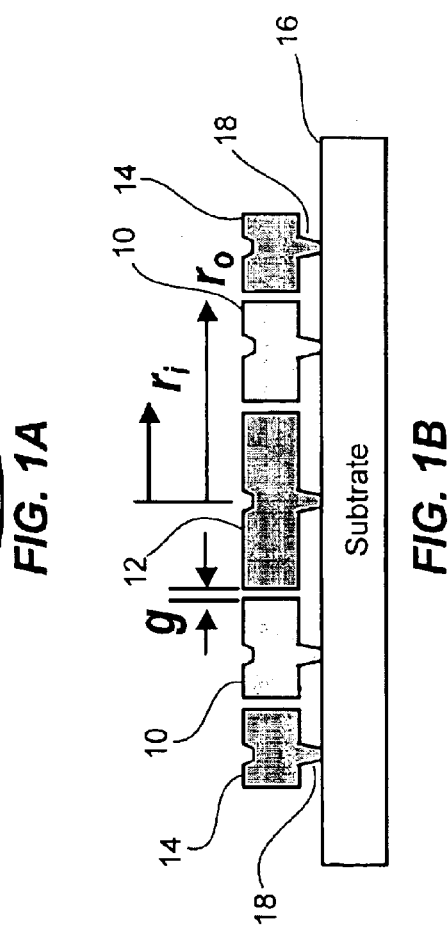

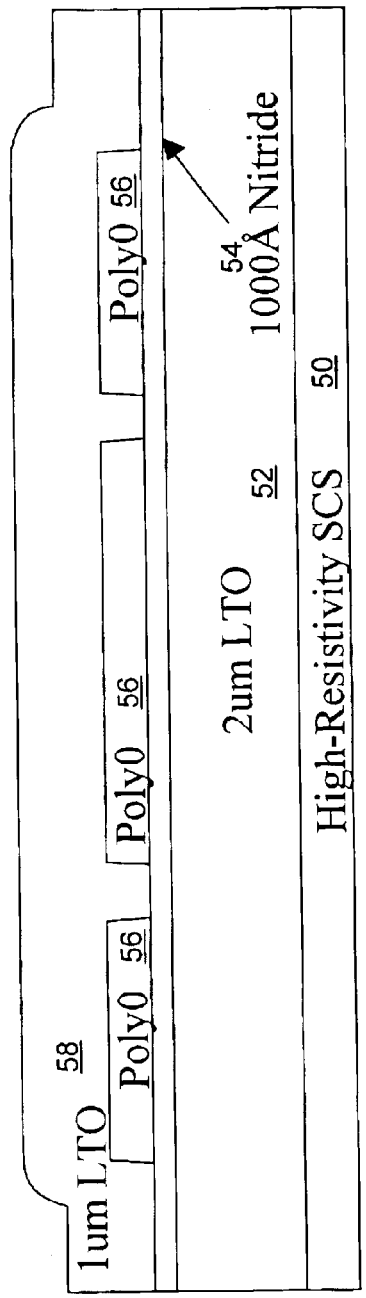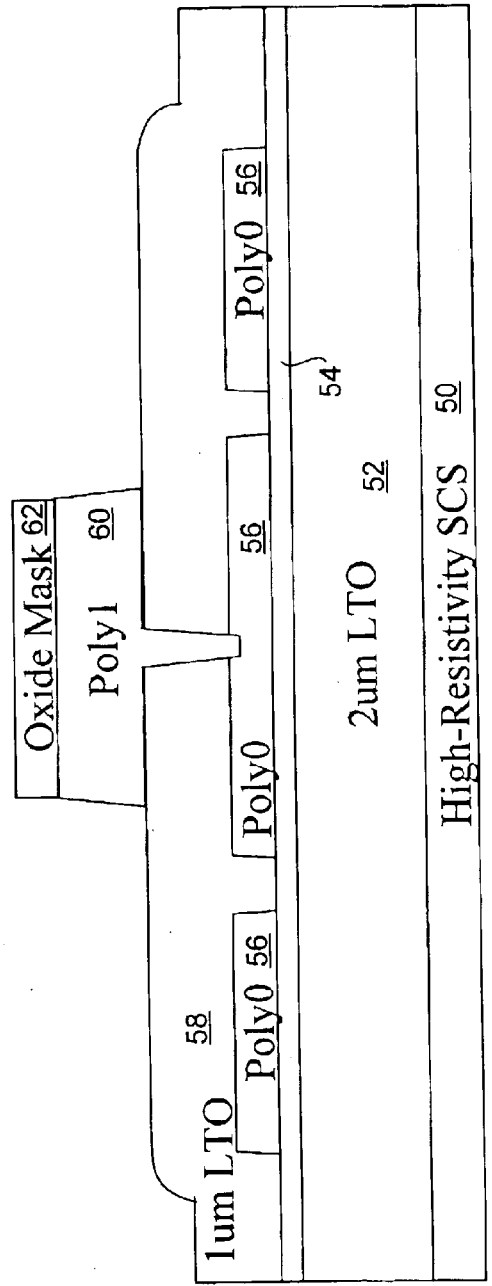

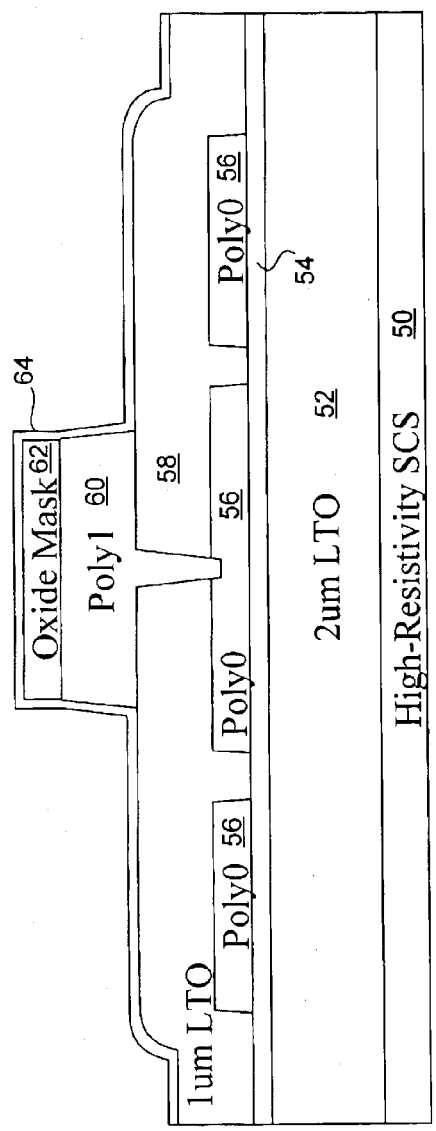
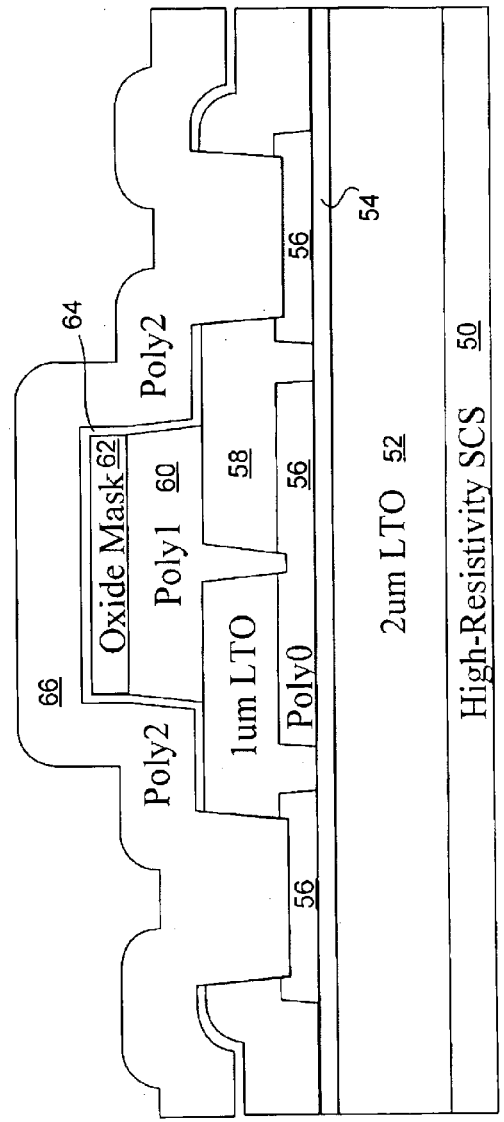
FIG. 7C
FIG. 7D

RADIAL BULK ANNULAR RESONATOR USING MEMS TECHNOLOGY

CROSS-REFERENCE TO RELATED APPLICATION

This application is related to pending application 10/140,137 filed May 6, 2002 for "MEMS Resonator and Method of Making Same."

BACKGROUND OF THE INVENTION

This invention relates generally to microelectrochemical systems (MEMS), and more particularly the invention relates to a mechanical resonator using MEMS technology.

Mechanical resonators are known which can operate as filters and as frequency sources in the VHF, UHF, and SHF frequency bands (i.e., ~30 MHz, to 30 GHz). Such resonators can be made using MEMS technology to provide ultra low power consumption, on-chip integration with communications circuits.

Co-pending application Ser. No. 10/140,137 discloses a MEMS resonator in which a bulk longitudinal bar resonates between a drive electrode at one end and a sense electrode at another end with the electrodes capacitively coupled to the resonating mass. The device is readily fabricated using semiconductor processing techniques. However, the width of the resonating mass and the capacitance gaps are limiting factors.

The present invention is directed to an annular resonator which offers flexibility in design and application.

SUMMARY OF THE INVENTION

In accordance with the invention, an annular resonator is provided. In one embodiment, the resonator has an interior electrode capacitively coupled to the inner radius and surface of the annular resonator, and an exterior electrode capacitively coupled to the outer radius and surface of the annular resonator. The inner and outer electrodes can have any desired geometry as long as they maintain uniform gaps between electrode and the inner and outer radial surfaces of the annular resonator, respectively. In accordance with the preferred embodiment, the inner and outer electrodes are annular in shape. Either electrode can be the drive electrode, and the other electrode will be the sense electrode. In piezoelectric embodiments, electrodes can be placed on the surface of the resonator.

The electrodes and resonator comprise materials which may include elemental, alloy, or compound semiconductors, metals, or piezoelectrics. The resonator structure can be formed in an thin film overlying a substrate with support anchors. The substrate and support anchors are used as mechanical support of the resonator. To decrease energy loss, the anchors are typically material posts located along a neutral axis or an axial radius along which the annulus resonator experiences no displacement under harmonic excitation. Advantageously, the substrate can comprise an electronic integrated circuit in which the resonator functions as a filter or frequency source.

For any given frequency, the annular resonator can be made as large or as small as desired. Accordingly, the surface area of the drive electrode and the surface area of the sense electrode can be designed for any value. The motional resistance of the resonator can, in principle, be made arbitrarily small. Further, the volume can be made arbitrarily large, thus increasing the Q of the filter. The annular resonator can be made with insertion losses comparable to discrete commercial filters.

The invention and object and features thereof will be more readily apparent from the following details description and appended claims when taken with the drawings.

BRIEF DESCRIPTION OF THE DRAWINGS

FIGS. 1A, 1B are a plan view and a side view in section of an annular resonator in accordance with one embodiment of the invention.

FIGS. 7A–7E are side views in section of a portion of the annular resonator during fabrication.

Like elements in the several views have the same reference numerals.

DETAILED DESCRIPTION OF ILLUSTRATED EMBODIMENTS

Figure 2:
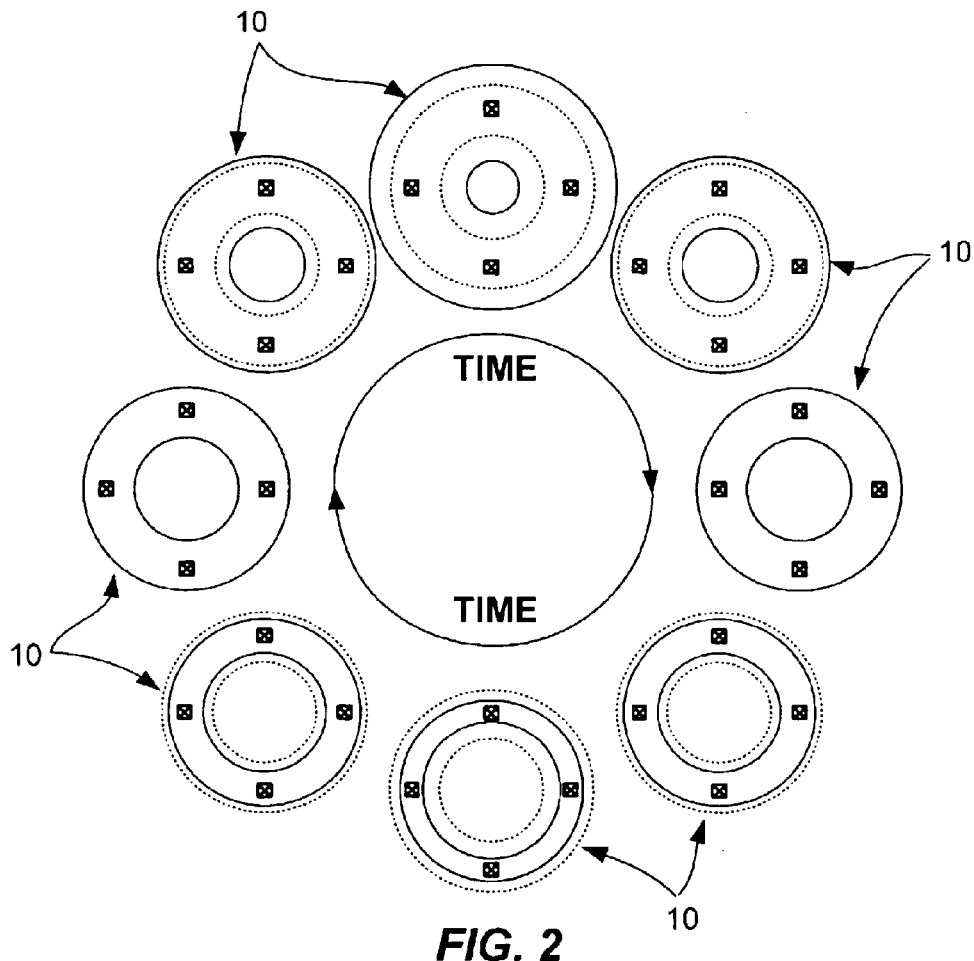
FIG. 2 schematically illustrates the second radial mode of vibration of the annular resonator of FIG. 1.

Referring now to the drawings, FIGS. 1A, 1B are a plan view and a side view in section illustrating one embodiment of a radial bulk annular resonator (RBAR) in accordance with the invention. The resonator 10 is a thin annular body having an inner surface and an outer surface with electrode 12 positioned within the inner surface and spaced therefrom and electrode 14 positioned around resonator 10 and spaced from the outer radius of the resonator. Inner electrode 12 and outer electrode 14 are labeled drive and sense electrodes, respectively. However, for capacitive drive and sense, the function of the electrodes can be reversed with no deleterious affects to operation of the device. That is, the outer electrode 14 can be used to drive while the inner electrode 12 can be used for sense. As shown in FIG. 1B, the gap between drive electrode 12 and resonator 10 is labeled g and the inner and outer radii of the resonator 10 are labeled $r_i$ and $r_o$, respectively. The two electrodes and the resonator are supported on a substrate 16 by means of anchors 18 which extend from the electrodes and resonator to substrate 16.

The resonator and drive electrodes can comprise an isotropic linearly elastic material which can be deposited in a microfabrication facility such as polycrystalline silicon (poly-Si), polycrystalline silicon-carbide (poly-SiC), polycrystalline silicon-germanium (poly-SiGe) and other materials compatible with microfabrication processes. The resonator operates by exciting the second radial mode of the annular disk, as illustrated in FIG. 2. In this mode, the resonator body expands and contracts in the radial direction about a neutral axis, which experiences no radial or tangential displacement. Anchors 18 supporting resonator 10 in FIG. 1B are placed along the neutral axis. The dashed line in FIG. 2 represents the unstrained annular resonator. In steady oscillation, the cycle continues indefinitely. It should be noted that the displacements shown in FIG. 2 are highly exaggerated for demonstration purposes.

Frequency calculations for the annular resonator are somewhat complicated, but an approximation for the frequency of operation, f, is given as:

$$f = \frac{1}{2(r_o - r_i)} \sqrt{\frac{E}{\rho(1-v^2)}}$$

Where E, ρ, and v are the Young's Modulus, mass density, and Poisson's ratio respectively, of the structural material, and $r_i$ and $r_o$ the respective inner and outer radii of the device. As $r_o \to \infty$ and $r_i$ is finite, this equation becomes exact. For finite $r_o$ and $r_i$, this equation is imprecise. Table 1 shows the results of computer models of the resonator. This table illustrates that, for any given target frequency, one can have an infinite number of different inner and outer radii. Thus, in theory, the bulk annular resonator can be as large, or as small, as desired, no matter what the frequency of operation. Also, for a given set of outer ($r_o$), inner ($r_i$), and neutral radii ($r_n$), scaling the frequency will inversely scale $r_o$, $r_i$, and $r_n$. Hence, if $r_o$=3 μm, $r_i$=1 μm, and $r_n$=2 μm at 1 GHz, then $r_o$=3× μm, $r_i$=1× μm, and $r_n$=2× μm at 1/× GHz.

| f (MHz) | Poly-SiC (um) | | | | Poly-Si (um) | | | | Poly-SiGe (um) | | | |
|---|---|---|---|---|---|---|---|---|---|---|---|---|
| | $r_i$ | $r_n$ | $r_o$ | $r_o-r_i$ | $r_i$ | $r_n$ | $r_o$ | $r_o-r_i$ | $r_i$ | $r_n$ | $r_o$ | $r_o-r_i$ |
| 10 | 1306.7 | 1619.9 | 1915.0 | 608.3 | 967.2 | 1195.9 | 1416.1 | 448.9 | 678.7 | 839.1 | 993.6 | 315.0 |
|  | 3227.0 | 3528.5 | 3830.0 | 602.9 | 2386.5 | 2611.1 | 2832.2 | 445.7 | 1674.6 | 1830.9 | 1987.3 | 312.7 |
| 100 | 130.7 | 162.0 | 191.5 | 60.8 | 96.7 | 119.6 | 141.6 | 44.9 | 67.9 | 83.9 | 99.4 | 31.5 |
|  | 322.7 | 352.8 | 383.0 | 60.3 | 238.7 | 261.1 | 283.2 | 44.6 | 167.5 | 183.1 | 198.7 | 31.3 |
| 1000 | 13.1 | 16.2 | 19.1 | 6.1 | 9.7 | 12.0 | 14.2 | 4.5 | 6.8 | 8.4 | 9.9 | 3.1 |
|  | 32.3 | 35.3 | 38.3 | 6.0 | 23.9 | 26.1 | 28.3 | 4.5 | 16.7 | 18.3 | 19.9 | 3.1 |

Table 1: Geometry specifications for RBARs of different materials at various frequencies. $r_n$ is the radius of the neutral axis. These specifications are typical, but not inclusive of all possible dimensions of the RBAR.

The frequency, f, is a very weak function of the thickness, t, of the structural layer. As t becomes large (i.e., t~$r_o$), the frequency will begin to decrease for a given set of $r_o$, $r_i$, and $r_n$. This is due to the Poisson effect. A finite element modeling (FEM) analysis of the 1 GHz poly-SiGe bulk annular resonator indicates that the mathematical model gives predicted resonant frequencies, f, within ±0.5% of the actual resonant frequency for t=1 μm.

Figure 3:
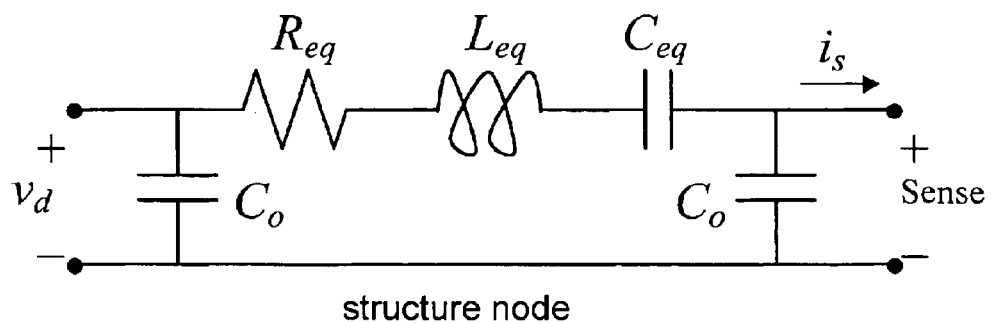
FIG. 3 is a circuit model of the annular resonator with electrostatic drive and capacitive sense.

FIG. 3 is a circuit model of the annular resonator with electrostatic drive and capacitive sense. Equivalent inductance ($L_{eq}$), equivalent capacitance ($C_{eq}$), and equivalent resistance ($R_{eq}$) are given by the following equations:

$$Req = \frac{\omega_n M_{eff}}{2QV_P^2\left(\frac{\partial C}{\partial x}\right)^2} \quad Leq = \frac{M_{eff}}{2V_P^2\left(\frac{\partial C}{\partial x}\right)^2} \quad Ceq = \frac{2V_P^2\left(\frac{\partial C}{\partial x}\right)^2}{K_{eff}}$$

Motional resistance is the value of $R_{eq}$ when the RBAR is operated at its intended resonant frequency. Small values of $R_{eq}$ are seen as advantageous for RF applications. It should be noted that, to reduce the motional resistance, $R_{eq}$, the capacitive gap, g, is often on the order of 30 to 100 nm. Hence, there can be a real danger of the instability known as pull-in. Gap-closing actuators will snap together if the voltage applied to them is such that y/g≦2/3, where y is the gap width after the voltage is applied. For a 1 GHz poly SiGe annular resonator with g=30 nm, the pull-in voltage $V_{pi}$, is well above 171 V. The field emission limit for free space is roughly 1 V/nm. So, $V_{bias}$ must be less than 30V, and pull-in is not a problem.

At resonance, Leq and Ceq cancel and the annular resonator is electronically equivalent to a resistor, Req. Req is a significant figure of merit in MEMS RF resonators and is directly related to the insertion loss.

Figure 4:
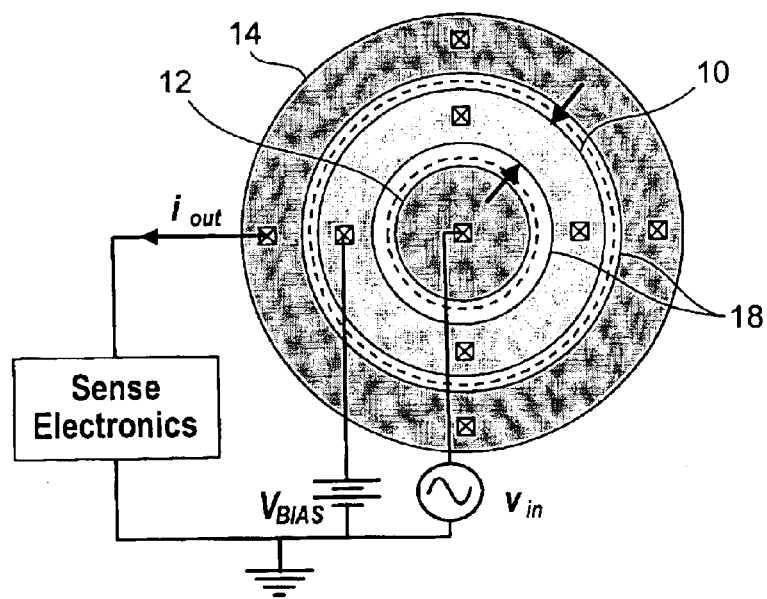
FIG. 4 is a schematic illustrating one embodiment of operation of the annular resonator.

FIG. 4 is a schematic illustrating operation of the annular resonator as an on chip RF filter. In this mode of operation, a capacitive drive and capacitive sense are employed. A DC bias is applied to the anchor support to the annular resonator 10, and an input signal is applied to the anchor support of the drive element 12. Sense electronics are connected to the outer annular sense electrode 14. To increase the drive and sense signal, it is advantageous to use gap-closing capacitors for both the drive and sense electrodes, as opposed to comb-drive capacitors. The best structural materials for the resonator are high Q materials that have high Young's moduli and high yield stresses (such as poly-Si, poly-SiGe, and poly-SiC). In practice, materials with fewer grain boundaries, such as single crystal solids, will likely increase the intrinsic Q of the resonator. For improved Q and operation performance, the annular resonator can be operated in vacuum to reduce fluidic damping and atomic absorptions/out-gassing.

Figure 5A:
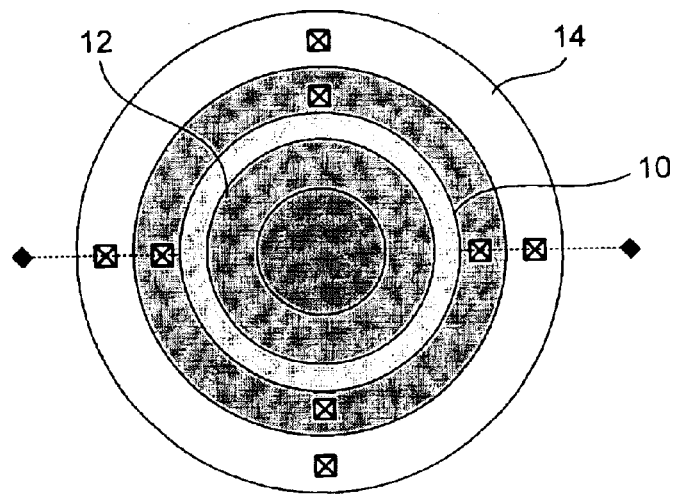
FIGS. 5A, 5B are a plan view and a side view in section of an annular resonator in according with another embodiment of the invention.
Figure 5B:
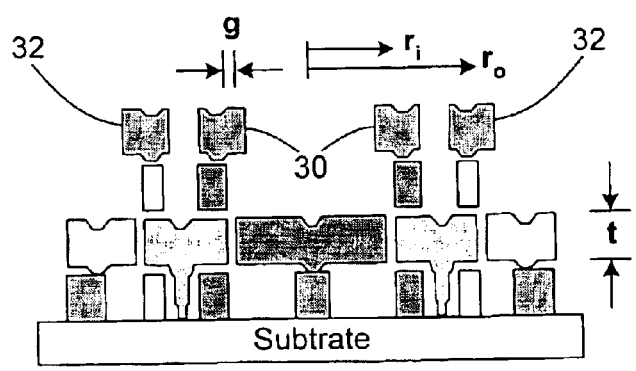

In a variation of the basic bulk annular resonator layout, a set of drive electrodes 30 and sense electrodes 32 can be positioned above and below the resonator as shown in FIGS. 5A, 5B. This adds to the drive and sense forces and can potentially add a second pole to the resonator system, enabling the creation of multi-pole filters with tailored pass bands. Further, this embodiment exploits the out of plane motion which is always present due to Poisson's effect. Modifications can be made to the anchor layout by adding anchors or removing anchors, since only one anchor is needed to hold the resonator above the substrate. Further, one continuous anchor can be created along the entire neutral axis of the resonator. The drive and sense electrodes can be more securely anchored by using an array of anchors.

Figure 6A:
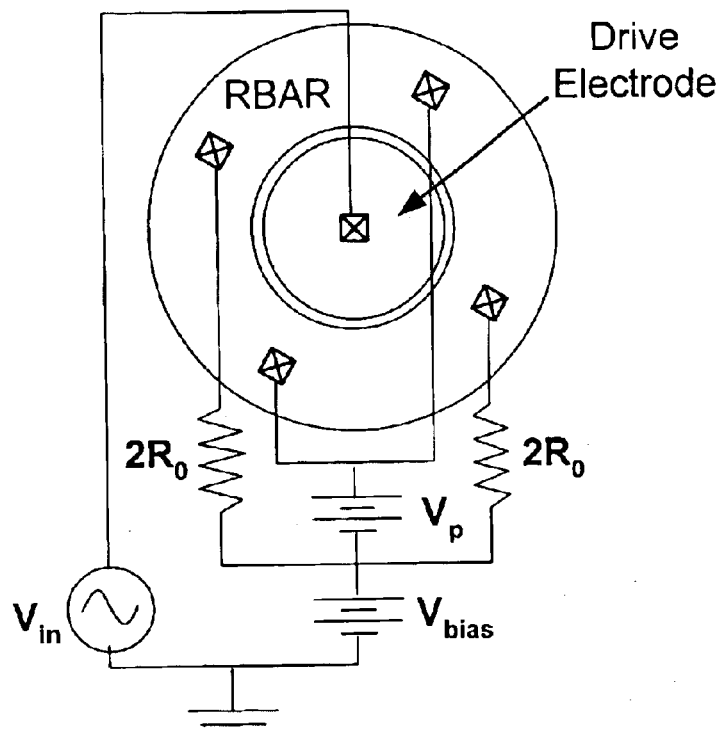
FIGS. 6A, 6B are schematics illustrating another embodiment of operation of the annular resonator.
Figure 6B:
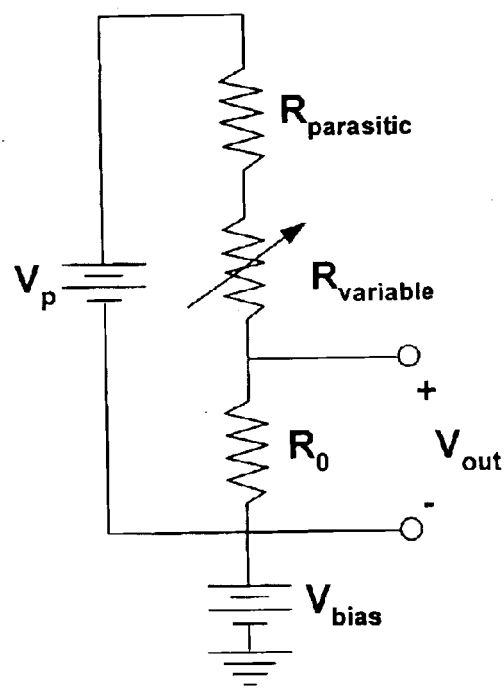

FIGS. 6A, 6B are a schematic and equivalent circuit which illustrate another mode of operation of the annular resonator which utilizes the piezo-resistive features of the resonator. During operation, the annular resonator experiences either a compressive or tensile strain over its entire bulk. If the structural material is piezo-resistive, there will be a net change in the resistivity of the bulk resonator as it goes from a compressive state to a tensile state. This variable resistor can be used to output the signal as illustrated in FIG. 6B. It should be noted that the output is a voltage as opposed to a current in this mode of operation.

One way to operate the annular resonator as a stable frequency source is to apply a voltage pulse to the drive terminal. The overtones of the resonator will be excited, especially the first and second radial modes. The current signal from the sense electrode can then be passed through an on-chip, low Q filter to filter all overtones except for the one that is desired. As the signal decays, another pulse can be applied to the resonator. In this way, a continuous frequency source is created.

The bulk annular resonator is readily fabricated using conventional semiconductor integrated circuit processing techniques. A variety of processes can be employed, and FIGS. 7A–7E are side views in section illustrating fabrication of the annular resonator in accordance with one embodiment. To facilitate illustration, only half of the resonator is shown, the portion of the resonator from the middle of the drive electrode through the sense electrode. In this embodiment, the structure is fabricated on a substrate of high resistivity single crystal silicon (SCS) 50. Two microns of low temperature oxide (LTO) 52 are deposited on a surface of substrate 50, and then 1000 angstroms of stoichiometric silicon nitride 54 is deposited on oxide layer 52. Thereafter, a 0.5 micron layer of doped, low stress polysilicon 56 (labeled Poly O) is deposited and then patterned and etched as shown to form a ground mask for the resonator. Thereafter, a 1 micron thick layer of low temperature silicon dioxide (LTO) 58 is deposited via low pressure chemical vapor deposition (LPCVD) techniques over the first layer of polysilicon 56.

Next as shown in FIG. 7B, oxide layer 58 is etched and removed over the middle Poly O layer 56, and then a second layer of polysilicon (Poly 1) 60 is deposited over oxide layer 58 with the Poly 1 layer contacting the poly 0 layer 56. Poly 1 layer 60 is a 1 micron thick doped, low stress polysilicon layer. Thereafter, 0.5 micron of low temperature oxide 62 is deposited, patterned and etched. It is to be used as a hard mask to pattern Poly 1, which forms the annular resonator 60 shown in FIG. 7B. It will be appreciated that Poly 1 60 is a continuous ring, but in this limited section view, only a section of the ring is illustrated.

Thereafter, as shown in FIG. 7C, 30 to 100 nanometers of spacer silicon dioxide 64 is deposited over the surface of the structure. As shown in FIG. 7D, openings to the poly 0 56 layers are formed and then a doped polysilicon layer 66 (Poly 2) is deposited which contacts the Poly 0 layers 56 in the openings. Poly 2 is 1 micron of doped low stress polysilicon.

Figure 7E:
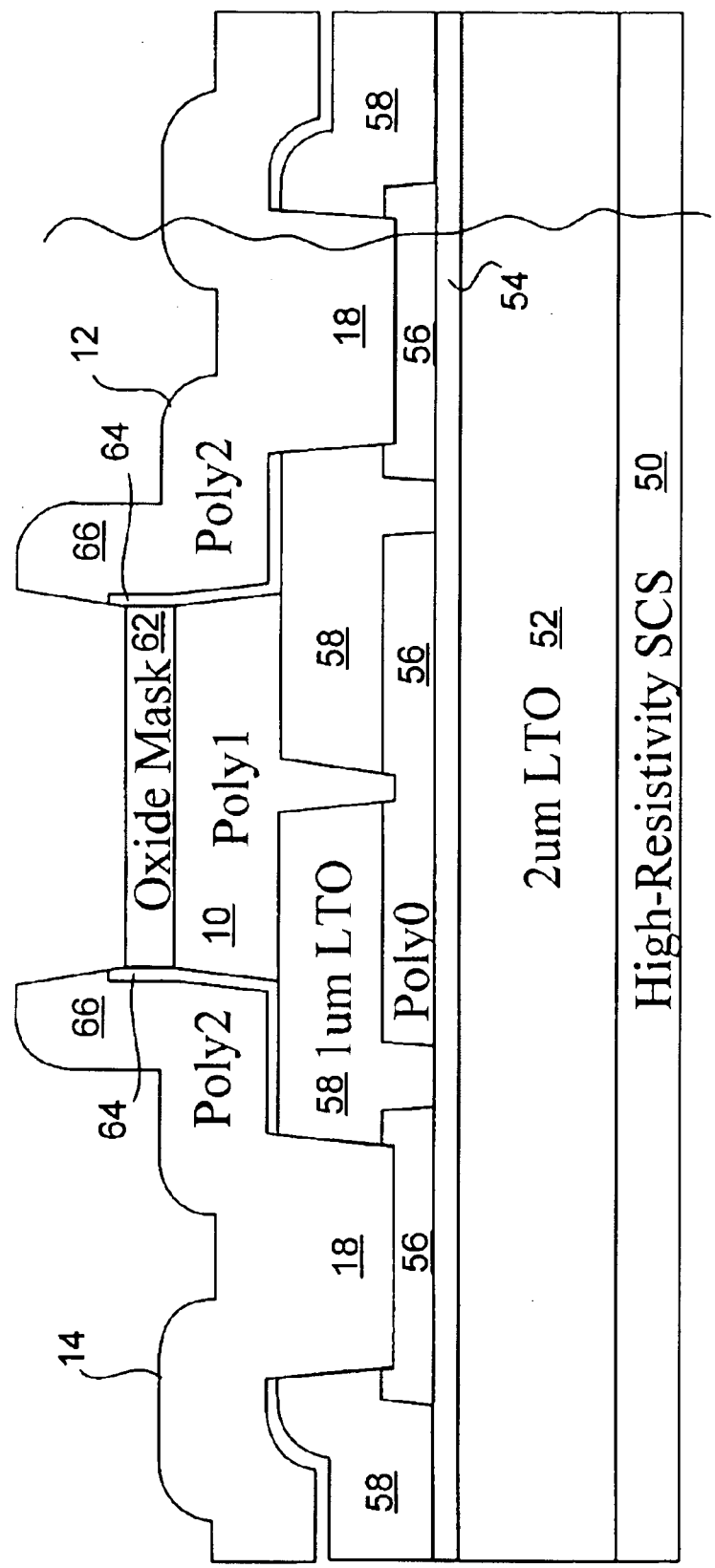

Thereafter, the Poly 2 layer 66 is etched as shown in FIG. 7E, forming sense electrode 14 (FIG. 1) and drive electrode 12 (FIG. 1) of the bulk annular resonator. Finally, the sense electrode 14 and the drive electrode 12 are released from annular resonator 10 by applying a preferential silicon dioxide etch, such as hydrofluoric acid, to remove silicon dioxide 58, oxide mask 62 and the thin layer of silicon dioxide 64. Silicon nitride layer 54 prevents the etching of underlying oxide layer 52. Anchors 18 remain in place to support resonator 10, sense electrode 14 and drive electrode 12 from the underlying substrate.

The MEMS radial bulk annular resonator, in accordance with the invention, lends itself to on-chip integration of filters for wireless RF communications systems. The resonator can operate in frequencies in the VHF, UHF, and SHF frequency bands with ultra low power consumption and very low insertion loss. By directly integrating the filter with foundry CMOS integrated circuits, parasitic effects are drastically reduced along with manufacturing costs.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A MEMS resonator comprising:
    a) an annular micromechanical resonator body defined by an inner radius and an outer radius,
    b) a first electrode positioned within the inner radius and spaced from and electrically coupled to the resonator body, and
    c) a second electrode positioned around the annular resonator body and spaced from the outer radius and electrically coupled to the resonator body, the first electrode and the second electrode providing drive to and sense of the resonator body.

2. The MEMS resonator as defined by claim 1 and further including a supporting substrate and a plurality of anchors for supporting the electrodes and resonator body on the substrate.

3. The MEMS resonator as defined by claim 2 wherein the substrate comprises an integrated circuit, the anchors connecting the drive electrode and sense electrode to the integrated circuit.

4. The MEMS resonator as defined by claim 3 wherein each anchor to the resonator body contacts the resonator body along a neutral axis where the resonator body experiences no radial or tangential displacement under the harmonic excitation of a second radial mode.

5. The MEMS resonator as defined by claim 4 wherein the annular resonator body is a material with high Young's modulus and high yield stress.

6. The MEMS resonator as defined by claim 5 wherein the material for the annular resonator body is selected from the group consisting of poly-Si, poly-SiGe, poly-SiC, Al, Cu, AlN, ZnO, and PZT.

7. The MEMS resonator as defined by claim 1 wherein the annular resonator body is a material with high Young's modulus and high yield stress.

8. The MEMS resonator as defined by claim 7 wherein the semiconductor material is selected from the group consisting of Si, SiGe, SiC, Al, Cu, AlN, ZnO, and PZT.

9. The MEMS resonator as defined by claim 1 wherein the resonator is smaller than 1 cm$^2$ in layout area.

10. The MEMS resonator as defined by claim 9 wherein the resonator operates at frequencies in the VHF, UHF, and SHF frequency bands.

11. The MEMS resonator as defined by claim 10 wherein the drive and sense electrodes are capacitively coupled to the resonator body.

12. The MEMS resonator as defined by claim 11 wherein the resonator body has top and bottom surfaces and further including a plurality of second drive electrodes adjacent to and spaced from the top and bottom surfaces and a plurality of second sense electrodes adjacent to and spaced from the top and bottom surfaces.

13. The MEMS resonator as defined by claim 1 wherein the drive and sense electrodes are capacitively coupled to the resonator body.

14. The MEMS resonator as defined by claim 13 wherein the resonator operates at frequencies in the VHF, UHF, and SHF frequency bands.

15. The MEMS resonator as defined by claim 14 wherein the resonator is smaller than 1 cm$^2$ in layout area.

16. The MEMS resonator as defined by claim 15 wherein the annular resonator body is a material with high Young's modulus and high yield stress.

17. The MEMS resonator as defined by claim 16 wherein the material for the annular resonator body is selected from the group consisting of poly-Si, poly-SiGe, poly-SiC, Al, Cu, AlN, ZnO, and PZT.

18. A MEMS resonator circuit comprising:
a) an annular resonator body of semiconductor material defined by an inner radius and an outer radius,
b) a first electrode positioned within the inner radius and spaced from the resonator body, and
c) a second electrode positioned around the annular resonator body and spaced from the outer radius,
d) an RF signal input coupled to one electrode,
e) a bias voltage terminal connected to the resonator body, and
f) a sense terminal coupled to receive a signal output from the other electrode.

19. The MEMS resonator circuit as defined by claim 18 wherein the resonator operates at frequencies in the VHF, UHF, and SHF frequency bands.

20. The MEMS resonator circuit as defined by claim 19 wherein the circuit functions as a filter in a RF transmitter/receiver ("transceiver").

21. The MEMS resonator circuit as defined by claim 20 wherein the annular resonator body is a material with high Young's modulus and high yield stress.

22. The MEMS resonator circuit as defined by claim 21 wherein the material for the annular resonator body is selected from the group consisting of poly-Si, poly-SiGe, poly-SiC, Al, Cu, AlN, ZnO, and PZT.

23. The MEMS resonator circuit as defined by claim 22 and further including a supporting substrate, the substrate comprising a RF transceiver integrated circuit coupled to the resonator circuit.

24. The MEMS resonator circuit as defined by claim 20 and further including a supporting substrate, the substrate comprising a RF transceiver integrated circuit coupled to the resonator circuit.

25. A MEMS resonator comprising:
a) an annular resonator body of piezo-resistive material defined by an inner radius and an out radius,
b) a drive electrode positioned adjacent to one radius and spaced from the resonator body, and
c) a plurality of sense electrodes positioned on a surface of the resonator body for sensing change in resistivity of the piezo-resistive material.

26. In a MEMS resonator, a resonator body comprising an annular material which can be capacitively driven to mechanical resonance frequencies.

27. The resonator body as defined by claim 26 wherein the material is selected from the group consisting of poly-Si, poly-SiGe, poly SiC, Al, AlN, ZnO, and PZT.

28. The resonator body as defined by claim 27 wherein the resonator operates at frequencies in the VHF, UHF and SHF bands.

* * * * *